United States Patent
Gagnard

(10) Patent No.: US 8,367,454 B2
(45) Date of Patent: Feb. 5, 2013

(54) IMAGE CAPTURE UNIT

(75) Inventor: Xavier Gagnard, Vif (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 124 days.

(21) Appl. No.: 12/767,213

(22) Filed: Apr. 26, 2010

(65) Prior Publication Data

US 2010/0297799 A1 Nov. 25, 2010

(30) Foreign Application Priority Data

Apr. 28, 2009 (FR) ...................................... 09 52790

(51) Int. Cl.
*H01L 21/00* (2006.01)
(52) U.S. Cl. . 438/65; 438/64; 257/E31.11; 257/E31.127
(58) Field of Classification Search .................... 438/64, 438/65; 257/433, E31.11, E31.127
See application file for complete search history.

(56) References Cited

U.S. PATENT DOCUMENTS

| | | | |
|---|---|---|---|
| 2002/0135069 A1 | 9/2002 | Wood et al. | |
| 2004/0256349 A1 | 12/2004 | Leib et al. | |
| 2005/0042786 A1 * | 2/2005 | Bieck et al. | 438/38 |
| 2006/0043262 A1 * | 3/2006 | Akram | 250/208.1 |
| 2009/0262226 A1 * | 10/2009 | Lee et al. | 348/294 |

FOREIGN PATENT DOCUMENTS

| | | |
|---|---|---|
| EP | 1378397 A2 | 2/2004 |
| JP | 2001351997 A1 | 12/2001 |
| JP | 2002329850 A1 | 11/2002 |

* cited by examiner

*Primary Examiner* — Charles Garber
*Assistant Examiner* — Abdulfattah Mustapha
(74) *Attorney, Agent, or Firm* — Wolf, Greenfield & Sacks, P.C.

(57) ABSTRACT

An image capture unit and its manufacturing method. The image capture unit includes a thinned-down integrated circuit chip having an image sensor on its upper surface side. A wall extends above a peripheral upper surface ring-shaped area, and a lens rests on the high portion of the wall.

9 Claims, 5 Drawing Sheets

IMAGE CAPTURE UNIT

CROSS REFERENCE TO RELATED APPLICATIONS

This application claims the priority benefit of French patent application number 09/52790, filed on Apr. 28, 2009, entitled "IMAGE CAPTURE UNIT," which is hereby incorporated by reference to the maximum extent allowable by law.

BACKGROUND OF THE INVENTION

1. Field of the Invention

The present invention relates to image capture units and to the forming of such units.

Such units are particularly well adapted to portable equipment such as cell phones, laptop computers, or video cameras.

2. Discussion of the Related Art

FIG. 1 illustrates an image capture unit according to prior art. An integrated circuit chip 1 comprises an image sensor 2 at its surface. The chip is glued on a printed circuit 3 and is electrically connected to this printed circuit by conductive wires. A wall 4 surrounds the package beyond the chip contour. This wall is made of molded resin. A lens 5 rests on the upper surface of the wall. The wall height is adjusted, by means not shown, so that the focal plane of the lens is at the level of the image sensor.

The assembly thus obtained forms an image capture unit welded on a printed circuit 3. The lens is capable of focusing the image of an external illuminated object on the integrated circuit chip.

The forming of such a unit requires multiple operations such as the assembly of the integrated circuit on the printed circuit, the molding of the wall, the gluing of the lens, the adjusting of the distance from the lens to the integrated circuit chip.

The reliability of the assembly depends on the quality of the mounting of the integrated circuit on the printed circuit, and on the quality of the mounting of the lens above the package.

The distance from the lens to the integrated circuit chip should be of a few millimeters with an accuracy of 10 micrometers, which accuracy requires a specific adjustment on each unit.

The surface area taken up by the image capture unit is much larger than the chip surface area.

The functional electrical testing of the image capture unit is performed after the integrated circuit has been separated and assembled on printed circuit 3.

SUMMARY OF THE INVENTION

An object of an embodiment of the present invention is to provide a reliable and inexpensive method for forming image capture units.

Another object of an embodiment of the present invention is to provide a forming method enabling to accurately control the chip-to-lens distance without requiring a distance adjustment step.

Another object of an embodiment of the present invention is to form an image capture unit of small surface area and of low height.

Another object of an embodiment of the present invention is to be able to test the functionality of image capture units located on a same wafer, before cutting.

An embodiment of the present invention provides a method for forming image capture units which comprises the steps of: forming a first wafer comprising, on a first surface, image sensors taking up active areas separated by separation areas, conductive passages associated with each active area extending at a given depth under the first surface of the first wafer; forming a second wafer comprising, on a first surface, blind cavities surrounded with walls corresponding to said separation areas; placing said first surfaces of the first and second wafer against each other by putting said separation areas in correspondence with said walls; abrading the first wafer from its second surface to reach the conductive passages; abrading the second wafer from its second surface to open the bottom of the cavities; gluing on the walls a plate comprising lenses having surfaces corresponding to said active areas; and cutting the resulting structure at the level of the walls to isolate image capture units.

According to an embodiment of the present invention, the image sensor is formed with MOS transistors.

According to an embodiment of the present invention, the conductive passages extend down to a depth from 50 to 300 μm, preferably 75 μm.

According to an embodiment of the present invention, second wafer W2 is made of silicon or glass.

According to an embodiment of the present invention, the blind cavities are dug down to a depth from 1 to 5 mm, preferably from 1.8 to 2 mm.

According to an embodiment of the present invention, a chem.-mech. etching abrades wafer W1 or wafer W2.

The foregoing objects, features, and advantages of the present invention will be discussed in detail in the following non-limiting description of specific embodiments in connection with the accompanying drawings.

DETAILED DESCRIPTION

Figure 1:
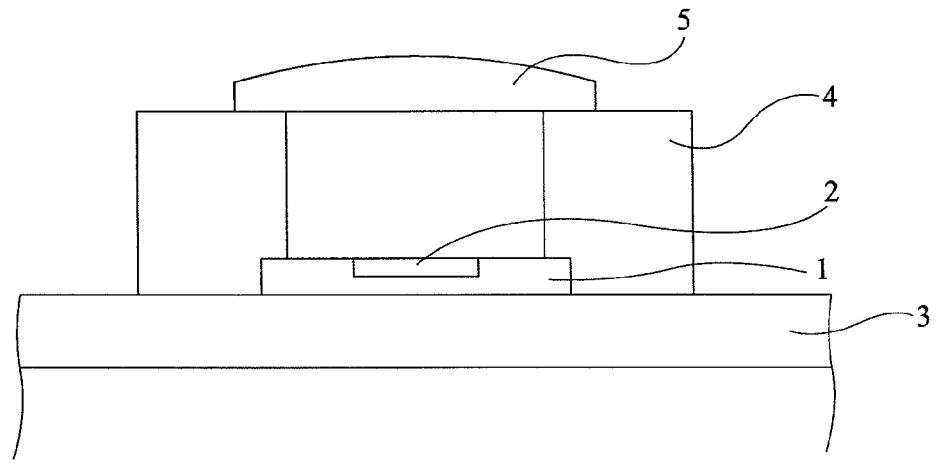
FIG. 1 illustrates an image capture unit according to prior art.

For clarity, the same elements have been designated with the same reference numerals in the different drawings and, further, as usual in the representation of integrated circuits, the various drawings are not to scale.

Generally, at least one embodiment of the present invention provides forming an assembly of image capture units on the same wafer before this wafer is cut into individual units. Thus, the methods for assembling the different units are carried out collectively on the wafer.

Figure 2:
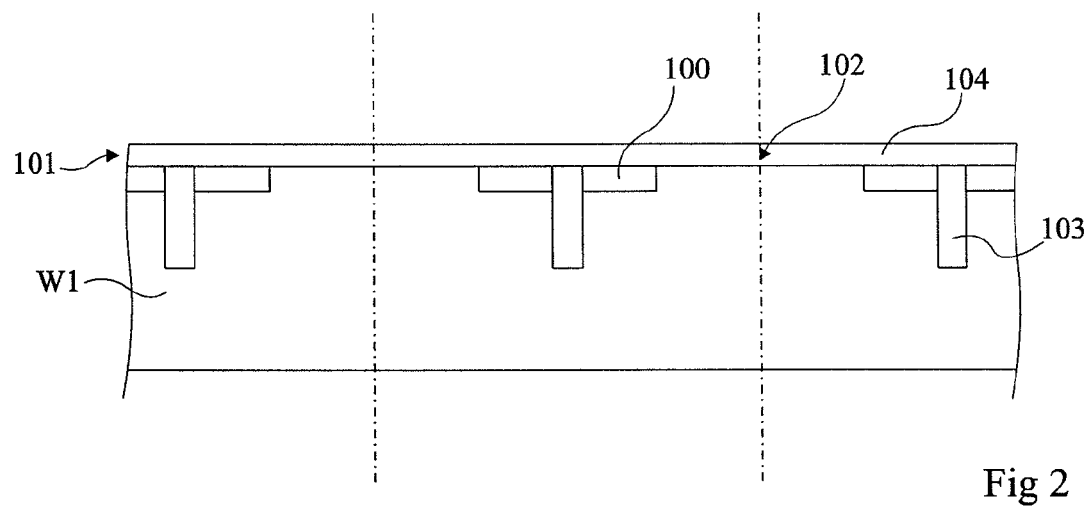
FIG. 2 shows a wafer of a semiconductor material in which many chips are arranged.

FIG. 2 shows a wafer W1 of a semiconductor material, for example, made of single-crystal silicon. This wafer currently used in semiconductor technology has a thickness ranging between 300 and 1,000 μm, preferably from 500 μm to 750 μm. The semiconductor material is of a first conductivity type. Many integrated circuit chips are arranged on the side of front surface 101 of wafer W1 in active areas 100. The active areas are separated by separation areas 102. Metal passages 103 penetrate under active areas 100 down to a depth ranging between 50 and 300 µm, preferably at a 75-µm depth under front surface 101 of wafer W1. The front surface is covered with an oxide 104 having a thickness greater than 0.05 µm.

Figure 3:
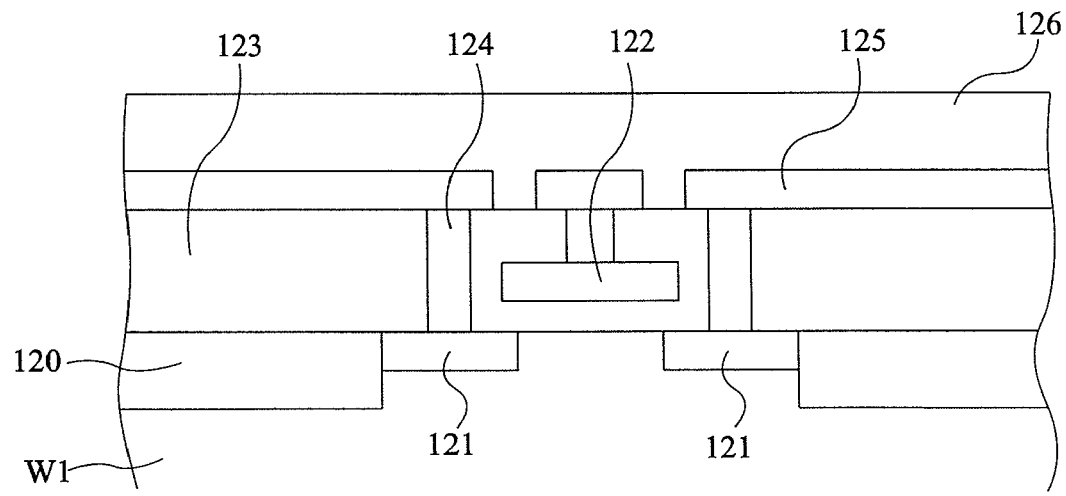
FIG. 3 illustrates a portion of the structure of a chip under manufacturing.

FIG. 3 illustrates a portion of the structure of a chip under manufacturing. This portion comprises a MOS transistor laterally insulated from other components by a field oxide 120. The MOS transistor comprises a doped source and drain 121 of the second type and a conductive control gate 122 arranged between the source and the drain and insulated from the semiconductor material. An insulator layer 123 is arranged above the transistors. Contacts holes 124 filled with a metal, for example, copper, are opened in layer 123 on the source, drain, and gate of the transistors. A metallization level 125, for example, made of copper, electrically connects the different elements forming the integrated circuit chip. An insulator 126 covers all interconnects.

Figure 4:
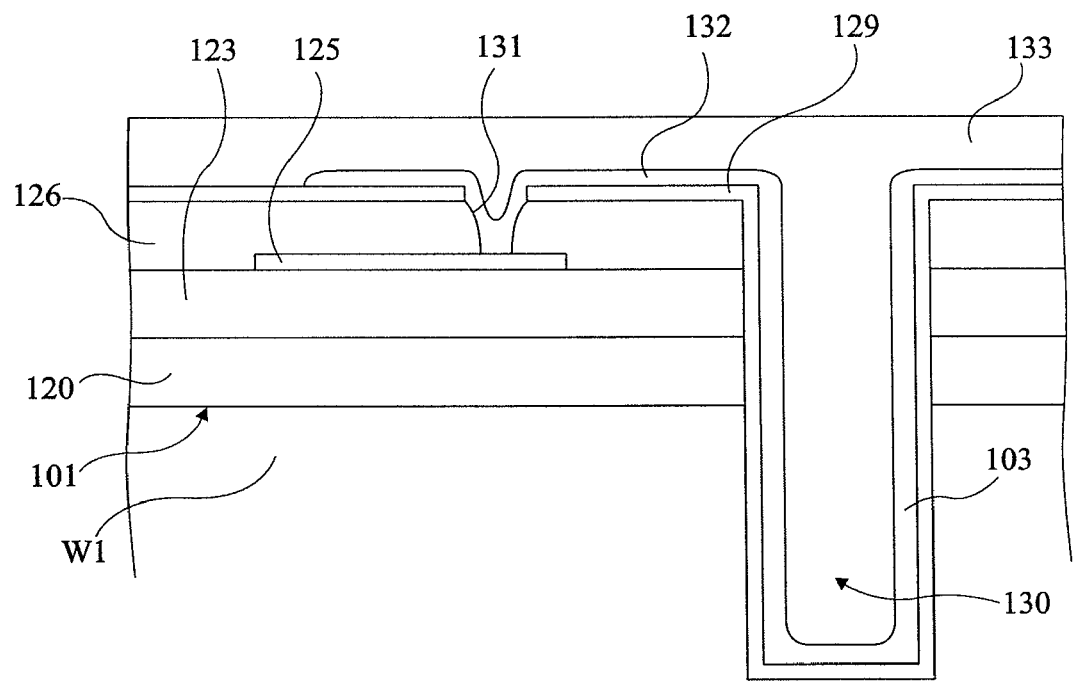
FIG. 4 illustrates an embodiment of the metal passages.

FIG. 4 illustrates an embodiment of metal passages 103. Metal passages 103 are formed after the deposition of insulating layer 126 covering first interconnect level 125. A hole 130 crosses insulator layer 126, insulator layer 123 deposited before first interconnect level 125, and field oxide 120. Hole 130 penetrates into the wafer down to a depth of several tens of micrometers, for example, from 10 to 100 µm, and preferably 75 µm, under surface 101 of the front surface of wafer W1. This hole has a substantially square shape, with sides of a few micrometers, for example, from 2 to 50 µm, preferably 10 µm. The is for example performed by using a plasma etching through a hard mask. An insulator layer 129 deposited on the wafer covers the internal walls and the bottom of the hole. Insulator wafer 129 also covers insulator 126, which covers interconnects 125. A contact opening 131 formed through insulating layers 126 and 129 locally exposes the surface of metal level 125. An etched metal deposition 132 simultaneously covers contact openings 131, the walls, and the bottom of hole 130, thus putting connections 125 of the chip in electric contact with metal passage 103 filling hole 130. An insulating layer 133 covers all the interconnects and fills the remaining space of hole 130. Metal passage 103 may be formed in many ways. In particular, the metal may be replaced with strongly-conductive polysilicon or with a silicon-metal alloy. Metal layer 132 may fully fill hole 130. Finally, the case where metal passage 103 is connected to a lower interconnect layer 125 via a contact opening 131, laterally offset with respect to hole 130 and to metal deposition 132, has been shown. It will be within the abilities of those skilled in the art to form an electric contact between metal passage 103 and other upper or lower interconnect levels, not shown. Eventually, an advantageous mode is to fill hole 130 with metal 103 etched by chem.-mech. polishing. Through layer 133 which covers all the interconnects, a contact opening emerging at the surface of metal 103 thus etched by chem.-mech. polishing enables to form an electric connection perpendicularly to metal passage 103 with an upper metallization level, not shown.

Figure 5:
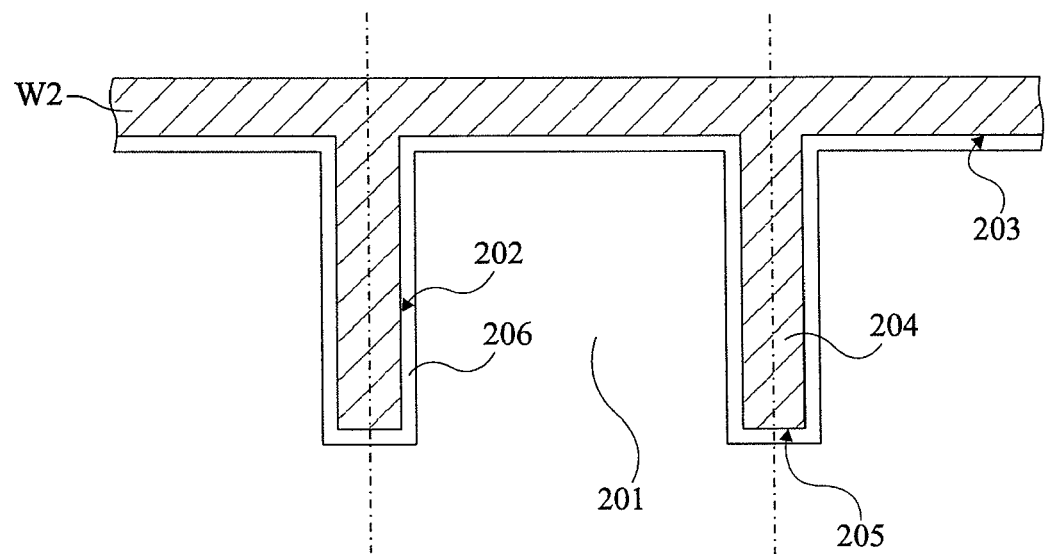
FIG. 5 shows a second wafer comprising cavities.

FIG. 5 shows a second wafer W2 made, according to an embodiment, of polysilicon. Wafer W2 has a thickness of a few millimeters, for example, from 1 to 5 mm, and preferably from 1.8 to 2 mm. Blind cavities 201 are etched on a horizontal surface of this wafer W2. Preferably, cavities 201 exhibit vertical sides 202 obtained by anisotropic plasma etching. Any other profile of sides 202, according to other embodiments, is possible. For example, an isotropic etching of cavities 201 generates a convex profile. Wavy profiles or profiles following the crystal plane may be obtained with plasma etchings or wet chemical etchings. Bottom 203 of the cavities is flat and parallel to the etched horizontal surface of wafer W2. This depth ranges between 0.5 and 4 mm, preferably 1.7 mm for a wafer having a 1.9-mm thickness. The accuracy obtained for this depth is better than 100 µm and preferably better than 10 µm. It is within the abilities of those skilled in the art to form such cavities with plasma or chemical etch techniques. The etching of many contiguous cavities in wafer W2 causes the creation of separation walls 204 between these cavities. Tops 205 of these walls all are in the same plane and substantially correspond to separation areas 102 located between active areas 100. The etched surface of wafer W2 and in particular tops 205 of these walls are covered with an oxide 206 having a thickness greater than 0.05 µm.

Figure 6:
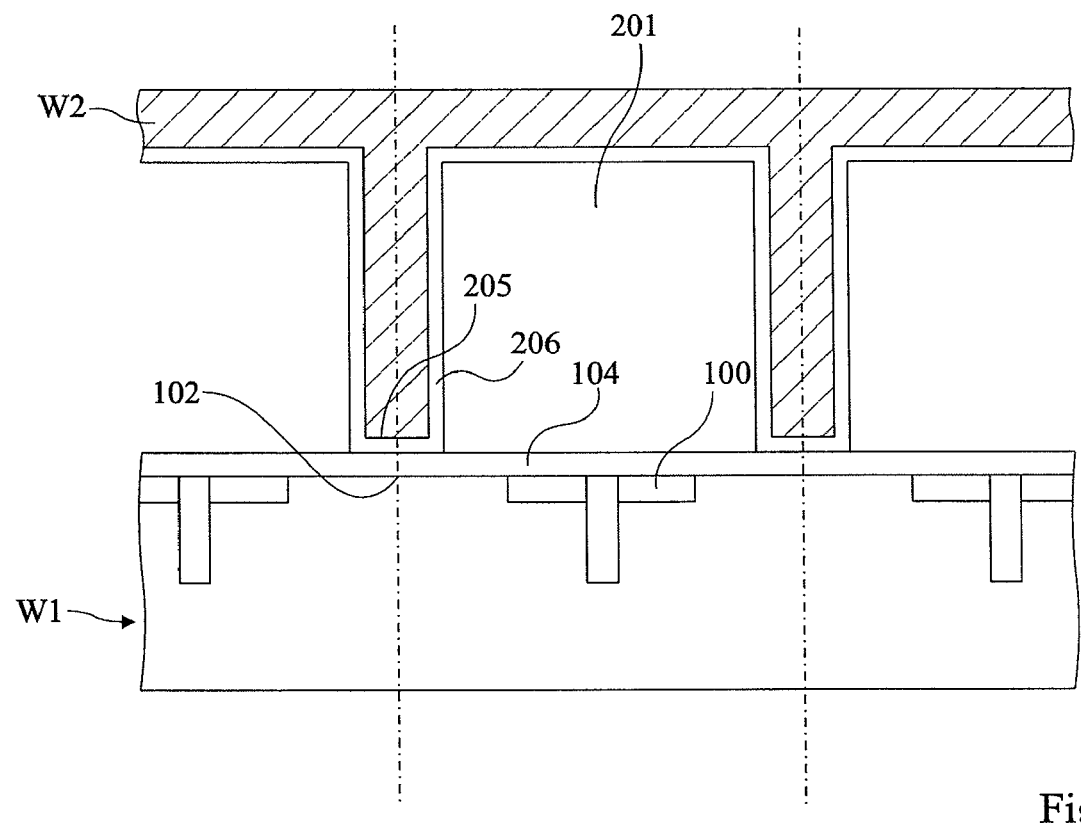
FIG. 6 illustrates the assembly of the first and second wafers.
Figure 7:
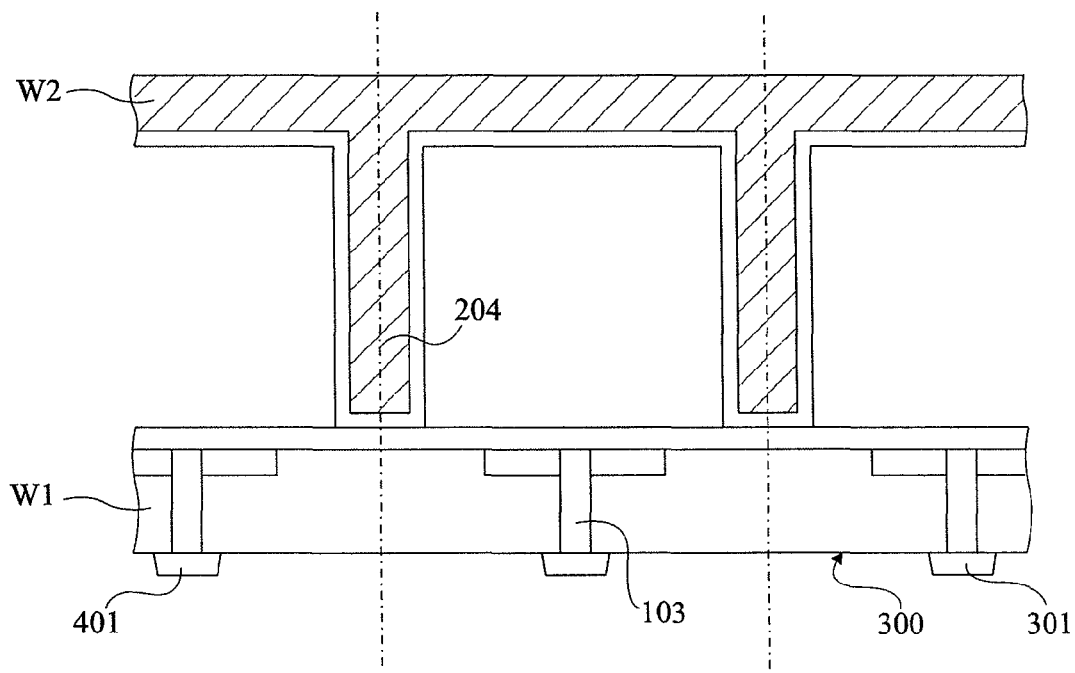
FIGS. 7 to 9 illustrate successive steps of an embodiment of the image capture units.

FIG. 6 illustrates the assembly of the first and second wafers W1 and W2 according to an embodiment. Separation areas 102 of first wafer W1 and corresponding tops 205 of the walls of second wafer W2 are placed opposite to one another so that oxide layers 104 covering the first wafer and 206 covering the second layer area in contact. A molecular bonding between oxide layers 104 and 206 attaches wafers W1 and W2 to each other. An assembly in which a cavity 201 is located above each chip is thus obtained. FIG. 7 illustrates a next step of the method for forming image capture units. The rear surface of wafer W1 is abraded so that metal passages 103 emerge on rear surface 300 in regions 301. During this operation, wafer W1 is maintained by the handle formed by thick substrate W2 comprising a lattice of walls 204. The rear surface may be lapped by chem.-mech. etching. The etch conditions change when the metal of metal passage 103 appears at the surface. The etching is then stopped. The remaining thickness of wafer W1 is then substantially equal to the depth of the metal passages. The assembly of wafers W1 and W2 remains mechanically rigid, especially due to the presence of wall lattice 204. Solder pads 401 in electric contact with the bottom of metal passages 103 are formed on the abraded surface of wafer W1. These pads are connected to the electric connections of the integrated circuit chip by metal passages 103. They enable to perform parametric and functional electric tests on the image capture units before any cutting of wafer W1.

Figure 8:
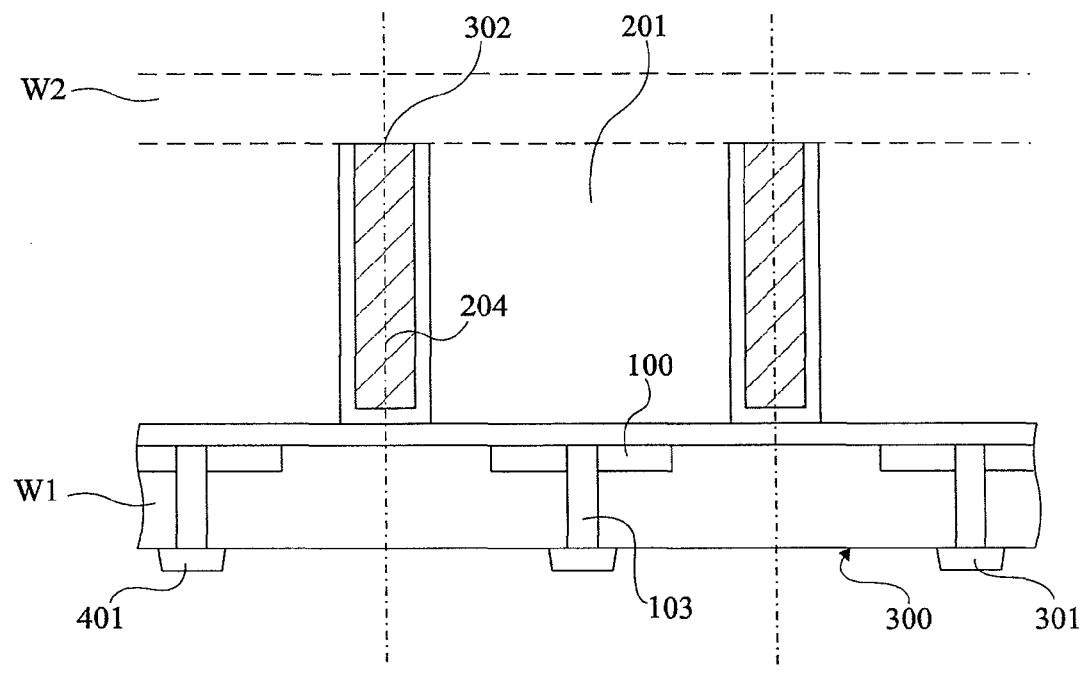

FIG. 8 illustrates a next step of the method for forming the image capture nits. Wafer W2 is abraded until cavities 201 are opened. The second surface of second wafer W2 may be lapped by chem.-mech. etch. As soon as cavities 201 are opened, the surface area to be etched becomes small, and the etch conditions change, which stops this etching. There only remain, of wafer W2, the walls trimmed level along planar surfaces 302. The accuracy of the vertical distance between planar surfaces 302 and active areas 100 results from the different etchings of the cavities and from the lapping of second wafer W2. This accuracy is better than 100 µm and is typically better than 10 µm. The stiffness of the assembly is obtained by the presence of walls forming a lattice. Accordingly, the chips located in active areas 100 are surrounded with walls 204 having a height substantially equal to the initial depth of cavities 201 of 1.7 mm in the context of the above example.

Figure 9:
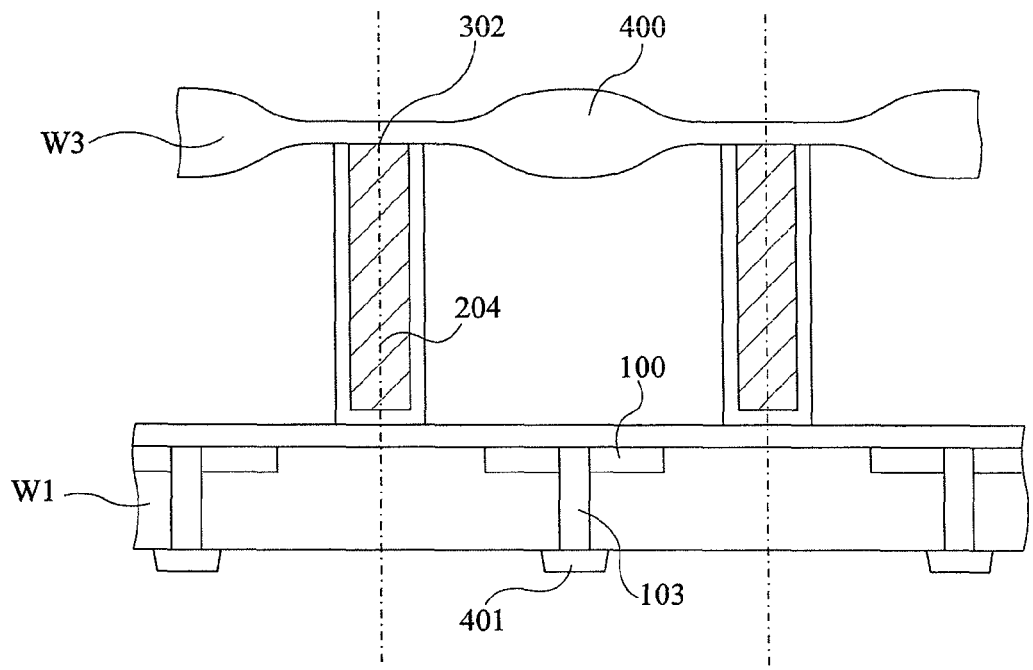

FIG. 9 illustrates a next step of the method for forming the image capture units. A plate W3 is glued on planar surface 302 of the walls. This plate is formed of optical lenses 400 distributed to correspond to active areas 100. Plate W3 is formed of molded glass or of transparent plastic. According to an embodiment, it is glued with a polyurethane glue locally dispensed on planar surfaces 302 of the walls. According to an embodiment, the focal plane of lenses 400 is substantially at the surface of the image sensors of the chips located in active areas 100. Any other positioning of the focal plane is possible according to the desired distance between the lens and the objects meant to have their image captured. The obtained image is clear if the accuracy of the focal plane positioning is below 100 μm and preferably below 10 μm. The wall manufacturing described in the provided embodiments of the present invention enables achieving this accuracy without using specific means for adjusting the distance after plate W3 has been glued.

Color filters may have been interposed between plate W3 comprising lenses 400 and the image sensors.

Figure 10:
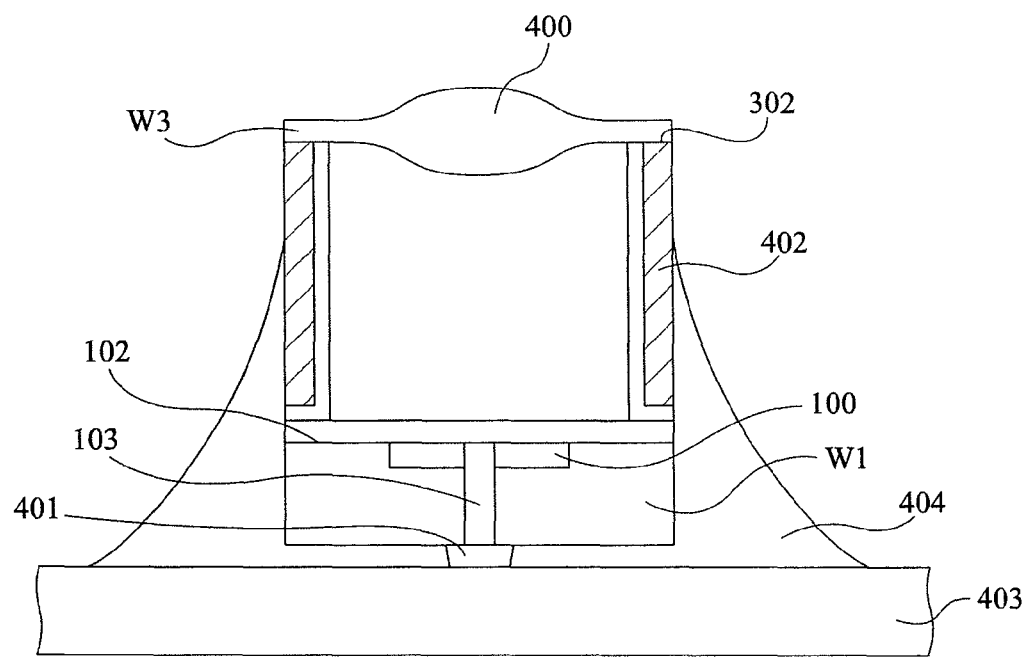
FIG. 10 illustrates an image capture unit according to an embodiment of the present invention.

FIG. 10 illustrates an image capture unit according to an embodiment. Wafer W1, walls 204, plate W3 are cut along the areas of separation of active areas 100. This cutting is preferably centered on walls 204 which are separated in two substantially equal portions 402. Multiple means may be used for the cutting. Especially, the laser or diamond saw currently used in integrated circuit technology may be used. An image capture unit comprising the integrated circuit chip located in active area 100, walls 402 located at the chip periphery, and an image focusing lens 400 glued on peripheral wall 402 are then obtained. Further, metal passages 103 ended by solder pads 401 emerge under this image capture unit. This module is shown to be welded on a printed circuit 403. The mechanical connection of the image capture unit on the printed circuit is preferably ensured by a glue 404 filling the space between cut wafer W1 and printed circuit 403. Glue 404 overflows on the circumference of the image capture unit.

The unit thus assembled on the printed circuit has a maximum compactness. The majority of the surface area of this unit is taken up by active area 100. Areas 102 of separation between active areas are small but should, however, be large enough to enable to cut the image capture units. Walls 402 and lens 400 do not extend beyond the cutting path crossing separation area 102.

The above-described specific embodiments are likely to have many variations. First wafer W1 may be a single-crystal or multiple-crystal wafer. Any material or alloy capable of detecting light radiations of various wavelengths may be used. Any technology associated with image sensors may be used, especially, MOS, FET, and bipolar transistors, diodes, CCDs (charge coupled devices).

In the example illustrated hereabove, the interconnect levels facing metal passages 103 may come in any number and position. The interconnect levels, and in particular metal passage 103, use metals. "Metals" means any material with a strong electric conductivity, such as aluminum, copper and their alloys, but also very heavily-doped silicon, silicon-metal alloys as well as, for example, any strongly-conductive nano-structure, such as silicon nanotubes.

The mentioned insulators may be composite layers comprising different types of insulating materials, including porous insulators and air.

Various embodiments have been provided hereabove for metal passage 103. The described embodiments are not exhaustive and, for example, the diffusion of aluminum into silicon is capable of forming such metal passages. For example, the etching of hole 130 may be performed after the lapping of the rear surface of wafer W1 and stop on the rear surface of metal interconnect 125. Metal deposition 132 then ensures an electric contact with interconnect 125 as in the described case.

There is a great variety of etch and deposition methods in technologies used in microelectronics. The methods mentioned hereabove are examples only. It will be within the abilities of those skilled in the art to provide, according to the aims to be reached, the best plasma, ionic, or water phase etch with the reactive compounds corresponding to the anisotropy or to the selectivity necessary for each type of etching.

The second wafer is preferably made of a rigid material, having an expansion coefficient similar to the expansion coefficient of the material used for the first wafer. Polysilicon is appropriate in the case of a first silicon wafer since its properties are stable and known. This is not the only choice, and transparent glass materials or synthetic compound materials, or plastic materials may in particular be used, provided to be able to be etched or molded, lapped, and glued with the described tolerances. Any system for gluing second wafer W2 on first wafer W1 or plate W3 may be used. In particular, glues projected by nozzles, especially polymer-type glues, may be dispensed.

Plate W3 should be transparent and mainly formed of lenses having optical properties adapted to the optical characteristics of the image capture unit. The shape and the complexity of these lenses are not limited. In particular, Fresnel lenses and a stack of lenses may be used, and protection and antireflection layers may cover the lenses. Wafer W3 may be molded, etched or stamped.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming image capture units, comprising the steps of:
    forming, at a first surface of a first wafer, image sensors taking up active areas separated by separation areas, and forming conductive passages associated with each active area extending down to a given depth under the first surface of the first wafer;
    forming, at a first surface of a second wafer, blind cavities surrounded with walls corresponding to said separation areas;
    bonding said first surfaces of the first and second wafers against each other by putting said separation areas in correspondence with said walls;
    abrading the first wafer from its second surface to reach the conductive passages;
    abrading, after the bonding, the second wafer from its second surface to open the bottom of the cavities;
    gluing on the walls a plate comprising lenses having surfaces corresponding to said active areas; and
    cutting the resulting structure at the level of the walls to isolate image capture units.

2. The method of claim 1, wherein the image sensor is formed with MOS transistors.

3. The method of claim 1, wherein the conductive passages extend down to a depth from 50 to 300 μm.

4. The method of claim 1, wherein second wafer W2 is made of silicon.

5. The method of claim 1, wherein second wafer W2 is made of glass.

6. The method of claim 1, wherein the blind cavities are etched down to a depth from 1 to 5 mm.

7. The method of claim 1, wherein said abrading steps are implemented by chemical-mechanical etching.

8. The method of claim 1, wherein the blind cavities are etched down to a depth from 1.8 to 2 mm.

9. The method of claim 1, wherein the conductive passages extend down to a depth of about 75 μm.

* * * * *